United States Patent [19]
Miyaji et al.

[11] Patent Number: 5,639,544
[45] Date of Patent: Jun. 17, 1997

[54] RESIN-IMPREGNATED FABRIC SHEET

[75] Inventors: Shinichiro Miyaji, Kouga-gun; Kenji Kida; Toshiaki Ueda, both of Otsu, all of Japan

[73] Assignee: Toray Industries, Inc., Japan

[21] Appl. No.: 338,629

[22] PCT Filed: Mar. 29, 1994

[86] PCT No.: PCT/JP94/00511

§ 371 Date: Nov. 29, 1994

§ 102(e) Date: Nov. 29, 1994

[87] PCT Pub. No.: WO94/22941

PCT Pub. Date: Oct. 13, 1994

[30] Foreign Application Priority Data

Mar. 31, 1993 [JP] Japan ................................. 5-073778
Mar. 31, 1993 [JP] Japan ................................. 5-073779

[51] Int. Cl.$^6$ ........................................................... B32B 5/16
[52] U.S. Cl. .......................... 422/117; 428/156; 428/213; 428/402; 428/901; 422/136; 422/180
[58] Field of Search ........................... 428/224, 156, 428/213, 257, 260, 265, 268, 240, 253, 281, 282, 283, 284, 285, 286, 288, 297, 402, 901

[56] References Cited

U.S. PATENT DOCUMENTS 4,389,453  6/1983  Kitanaka et al.

FOREIGN PATENT DOCUMENTS

| 0 182 335 A3 | 5/1986 | European Pat. Off. . |
| 0 524 343 A1 | 1/1993 | European Pat. Off. . |
| 57-96588 | 6/1982 | Japan . |
| 57-96024 | 6/1982 | Japan . |
| 57-120409 | 7/1982 | Japan . |
| 59-3991 | 1/1984 | Japan . |
| 60-52943 | 11/1985 | Japan . |
| 63-237949 | 10/1988 | Japan . |
| 1095585 | 4/1989 | Japan . |
| 5069504 | 3/1993 | Japan . |

*Primary Examiner*—Richard Weisberger
*Attorney, Agent, or Firm*—Austin R. Miller

[57] ABSTRACT

In a sheet wherein a fabric sheet (A) is impregnated with a resin composition (B) containing poly-p-phenylene sulfide as a major component, by controlling the orientation degree of the resin composition (B) within the range between 0.3 and 0.9, heat resistance, thermal dimensional stability, dielectric characteristics and mechanical properties when bent are largely improved, so that the resin-impregnated fabric sheet may suitably be used as an insulation substrate for circuit boards and for multilayer wiring boards to which high densification of the circuits and decrease in the thickness are demanded.

7 Claims, No Drawings

RESIN-IMPREGNATED FABRIC SHEET

TECHNICAL FIELD

The present invention relates to a resin-impregnated fabric sheet comprising a fabric sheet in which poly-p-phenylene sulfide resin is impregnated. More particularly, the present invention relates to a resin-impregnated fabric sheet having excellent heat resistance, thermal dimensional stability, high frequency characteristics, mechanical properties and the like, which is suited for circuit boards having small thickness.

BACKGROUND ART

In the fields of electricity and electronics, to attain compaction and high performance of devices, a circuit board having characteristics well balanced at a high level, such as heat resistance, thermal dimensional stability, mechanical properties, low hygroscopicity, fire retardance, high frequency characteristics and the like, is demanded. It is further demanded for the circuit board to attain processing of signals at a high speed and to have small thickness. Therefore, the insulation substrate used for the circuit board also has to satisfy the above-mentioned demands.

Conventional insulation substrates used in this field include substrates comprising a glass cloth in which an epoxy resin is impregnated (hereinafter also referred to as "epoxy resin-impregnated substrate"), polyimide films, fluorine-contained films and the like. However, the epoxy resin-impregnated substrates have high hygroscopicity and poor high frequency characteristics, and it is difficult to make the thickness thereof small. Although polyimide films have good heat resistances, they have high hygroscopicities and poor high frequency characteristics. Fluorine-contained films have poor adhesivenesses, so that it is not easy to mount electro-conductive pastes or to be plated when forming through holes.

To employ a non-oriented sheet of poly-p-phenylene sulfide (poly-p-phenylene sulfide is hereinafter also referred to as "PPS", and non-oriented sheet of poly-p-phenylene sulfide sheet is hereinafter also referred to as "PPS sheet") as the insulation substrate of a circuit board is disclosed in Japanese Laid-open Patent Application (Kokai) No. 56-34426, and to employ a biaxially oriented film of PPS (hereinafter also referred to as "PPS film") as the insulation substrate of a circuit board is disclosed in Japanese Laid-open Patent Application (Kokai) No. 55-36945. These techniques are highly drawing attention recently.

However, although PPS sheets when used alone have satisfactory thermal dimensional stabilities, low hygroscopicities, fire retardances, high frequency characteristics and the like, the temperature to which they can stand is lower than that of biaxially oriented films (i.e., they are likely to thermally deform at temperatures higher than glass transition points). Further, the larger the number of heating steps, the more the crystallization, so that the more the brittleness. In cases where a PPS sheet is used for a printed circuit board, the heat resistance and brittleness are made to be satisfactory to some degree by controlling the crystal size and the like, there is a problem that PPS sheet likely to thermally deform when heated quickly.

PPS films when used alone exhibit dimensional change due to heat shrinkage, so that circuits are likely to be shifted when heat is applied during the manufacturing process of the circuit board. Further, they are easily broken when forming through holes in laminated circuit boards. Thus, their application is limited in the fields wherein thermal dimensional stability is highly demanded.

On the other hand, the following laminates comprising PPS films are known.

(1) A laminate comprising a fabric sheet made of an aromatic polyamide, with which a PPS film is adhered by an adhesive is disclosed in Japanese Laid-open Patent Application (Kokai) No. 60-63158.

(2) A laminate comprising a fabric sheet which is not melted at 300° C. and has a thermal expansion coefficient at 150° C. of not more than $50 \times 10^{-6}$ 1/° C. and a PPS film is disclosed in Japanese Laid-open Patent Application (Kokai) No. 1-95585.

(3) PPS molded sheets reinforced with a glass fabric sheet are disclosed in Japanese Patent Publication (Kokoku) No. 60-50146, Japanese Laid-open Patent Application (Kokai) No. 57-96024, and so on. Further, to use these sheets for printed circuit boards is disclosed in Japanese Patent Publication (Kokoku) No. 60-52943, Japanese Laid-open Patent Application (Kokai) Nos. 59-3991 and 58-80890, and so on.

(4) A laminate comprising a glass fabric sheet to which a PPS sheet is adhered by heat melt, and a circuit board based on this laminate are disclosed in Japanese Laid-open Patent Application (Kokai) No. 4-224941.

(5) A laminate Comprising a glass fabric sheet, a PPS sheet and a PPS film, in the order mentioned, the PPS sheet and the PPS film being adhered by heat melt, as well as a circuit board based on this laminate, is proposed in Japanese Laid-open Patent Application (Kokai) No. 4-232739.

However, the above-described laminates and glass fabric sheets have the following problems.

In the laminate described in (1), the layers are adhered via an adhesive, so that the heat resistance of the adhesive adversely affects the substrate (i.e., the heat resistance of the whole substrate is governed by the heat resistance of the adhesive). Therefore, the excellent characteristics of PPS cannot be well exploited. Further, since the resin is not impregnated in the fabric sheet, there are problems that the electro-conductive paste may be impregnated, metal plating cannot be carried out (it is difficult to plate a metal because burrs of the fabric are formed), and so on.

In the laminate described in (2), a PPS film and a fabric sheet are laminated by adhesion by heat melt. Therefore, although the laminate has an excellent heat resistance, the adhesion is poor, so that the film layer and the fabric sheet layer are easily peeled when a stress such as bending stress is exerted.

In the sheet described in (3) comprising a glass fabric sheet in which PPS resin is impregnated, cracks are likely to be formed when a stress such as bending or punching is exerted, so that the processing of the circuit board is problematic. Thus, its use in the field in which the small thickness of the circuit board is demanded is restricted.

The laminate described in (4) has also problems in mechanical properties as the sheet described in (3). Further, since the degree of impregnation of the PPS resin into the glass fabric is small, formation of through holes is problematic.

In the laminate described in (5) too, the degree of impregnation of the PPS resin in the glass fabric is low, so that the formation of through holes is problematic. Further, since the strength of adhesion between the PPS sheet layer and the PPS film layer is not high, if a strong impact such as punching is applied, they may be peeled, so that the applications of the laminate are restricted.

DISCLOSURE OF THE INVENTION

An object of the present invention is to overcome the above-mentioned drawbacks in the prior art and to provide an insulation substrate having heat resistance, thermal dimensional stability, low hygroscopicity, fire retardance, high frequency characteristics and the like well balanced at a high level, which has excellent mechanical properties and processability of the circuit board such as formation of through holes, which is suited for circuit boards having small thickness.

That is, the present invention provides a resin-impregnated fabric sheet comprising a fabric sheet (A) and a resin composition (B) containing poly-p-phenylene sulfide as a major component, impregnated in said sheet, said resin composition (B) having an orientation degree of 0.3–0.9.

Since the resin-impregnated fabric sheet according to the present invention has the above-described constitution, the sheet retains good heat resistance, thermal dimensional stability, dielectric properties and the like, while the mechanical properties when bent demanded for an insulation substrate for circuit boards are largely improved.

BEST MODE FOR CARRYING OUT THE INVENTION

The term "fabric sheet (A)" herein means a sheet made of fibers, which has a small thickness. The sheet include those referred to as cloths, fabrics, felts, non-woven fabrics, papers and the like. The sheet preferably has a thickness of 10–700 μm (more preferably 10–500 μm). The sheet includes those made of glass fibers, liquid crystalline fibers, carbon fibers, fluorine-contained fibers, aramide fibers and the like. The fabric sheet may be modified by, for example, being provided with adhesiveness or colored. Two or more types of fibers may be mixed and used for constituting the fabric sheet, or fabric sheets made of different types of fibers may be laminated. The ratio (K/L) of the basis weight (K) (g/m$^2$) of the fabric sheet to the thickness of the fabric sheet (L)(μm) may preferably be 0.3–1.2 because anisotropy of the dimensional stability is good. Among the above-mentioned fabric sheets, glass fabric sheets are preferred in view of electric properties and thermal dimensional stability. Especially, cloths made of glass fibers are preferred in view of heat resistance, dimensional stability and processability. In particular, glass fiber cloths having a ratio of average densities of warps and wefts (average density of warps/average density of wefts, hereinafter referred to as "density ratio") of 0.7–1.4 are preferred in view of dimensional stability.

It is preferred that the above-described fabric sheet does not have a melting point below to 400° C., that is, it is preferred that the fabric sheet be not melted at 400° C. The term "not melted" herein means that the fabric sheet is not fused or softened at 400° C. Unless the fabric sheet has this property, when the circuit board is exposed to a temperature of 300° C., the dimensional stability of the circuit board is insufficient.

In the present invention, the term "poly-p-phenylene sulfide" (hereinafter also referred to as "PPS" for short) means a polymer containing repeating units represented by the formula —(—S—)— in an amount of not less than 80 mol % (preferably not less than 90 mol %). If the content of this component is less than 80 mol %, the crystallinity, thermal transition temperature and the like are low, so that the high heat resistance, dimensional stability and mechanical properties, which are characteristics of the PPS-based resin compositions are deteriorated.

In the above-described PPS, units having a copolymerizable sulfide bond may be contained as long as the content thereof is less than 20 mol %, preferably less than 10 mol %.

In this case, the copolymer may be a random copolymer or a block copolymer.

In the present invention, the term "composition containing poly-p-phenylene sulfide as a major component" (hereinafter also referred to as "PPS composition") (B) means a composition containing poly-p-phenylene sulfide in an amount of not less than 60% by weight. If the PPS content is less than 60% by weight, mechanical properties, heat resistance, hot melt adhesion and the like of the sheet impregnated with the composition are deteriorated. The composition may contain, in an amount of less than 40% by weight, polymers other than PPS, and additives such as inorganic and organic fillers, lubricants, coloring agents and the like. The melt viscosity of the PPS composition may preferably be 100–50,000 poises (more preferably 500–20,000 poises) at 300° C. under a shearing velocity of 200 sec$^{-1}$ in view of processability.

The resin-impregnated fabric sheet according to the present invention is a sheet comprising the above-described fabric sheet in which the PPS resin composition is impregnated. The thickness of the sheet is preferably 20–1000 μm (more preferably 50–700 μm). The term "impregnated" herein means that each fiber constituting the fabric sheet is surrounded by the resin and adhered therewith.

As for the ratio of the PPS resin layer to the fabric sheet in the resin-impregnated fabric sheet according to the present invention, the ratio (b/a) of the thickness (b) of the layer made of PPS alone to the thickness of the fabric sheet layer (a), when each layer is observed by observing the cross-section of the sheet with an electron microscope, is preferably 0.25–2.5 in view of the mechanical properties, impregnation degree, thermal dimensional stability and surface smoothness. The ratio (b/a) is more preferably 0.4–2.3 and still more preferably 0.5–2.0. The layer (a) is not necessarily located at the center in the direction of thickness of the resin-impregnated fabric sheet but may be in a position shifted from the center to one side.

The above-mentioned layer (b) must have an orientation degree of 0.3–0.9. The orientation degree may preferably be 0.5–0.9, more preferably 0.6–0.85. The term "orientation degree" (hereinafter referred to as "OF") herein means the orientation degrees measured by wide angle X-ray diffraction method in the Edge direction and in the End direction. The orientation degrees in both directions must be within the range between 0.3 and 0.9.

The "orientation degree measured in the Edge direction (or End direction)" is defined as the ratio $(I\phi=30°)/(I\phi=0°)$ wherein $(I\phi=0°)$ means the degree of blackness obtained by taking an X-ray plate photograph by impinging X-ray from the direction parallel to the resin surface of the resin-impregnated fabric sheet and also parallel to the widthwise direction (or longitudinal direction), and scanning the diffraction intensity of the PPS crystals from (2 0 0) face along the equator to the radial direction, and $(I\phi=30°)$ means the degree of blackness to the direction of 30°, obtained by the same method. If the above-mentioned OF is less than 0.3, the thermal dimensional change is large, and if it is more than 0.9, the improvement in the mechanical properties of the resin-impregnated fabric sheet when bent, which is the primary object of the present invention, cannot be attained. Therefore, this requirement is important for attaining the object of the present invention.

The resin-impregnated fabric sheet according to the present invention has a ratio (x/y) of not more than 4.0, more preferably not more than 3.5, in view of the isotropy of the dimensional change, mechanical properties and the like, wherein the ratio (x/y) means the ratio of the maximum value (x) to the minimum value (y) which are obtained by measuring the angle dependence of the molecular orientation degree of the PPS resin layer in the impregnated sheet employing as the base axis a direction existing in the same plane as the sheet. The term "isotropy" herein means that the directional dependence of the characteristics of the resin-impregnated fabric sheet is small. If the above-described (x/y) is more than 4.0, the directional dependencies of the dimensional change, mechanical properties and the like are large, so that production of a circuit board having a high density tends to be difficult.

The term "impregnation" herein means that each fiber constituting the fabric sheet is surrounded by the resin and adhered therewith. The term "resin impregnation degree" of the resin-impregnated fabric sheet according to the present invention herein means the ratio, in terms of %, of the total of the length of the arcs of the fibers contacting the resin or the fiber next thereto to the total of the length of circumferences of the fibers, which are measured by observing the cross-section of the sheet with an electron microscope. The impregnation degree is preferably not less than 85%, more preferably not less than 90%. If the impregnation degree is less than 85%, the dimensional change is large, so that it is difficult to apply the substrate to a circuit board to which high precision is demanded. In addition, electro-conductive paste may permeate into the sheet and plated metal layer is not well adhered, so that it is difficult to form through holes for communicating different layers in the circuit.

The average surface roughness (Ra) of the resin-impregnated fabric sheet according to the present invention may preferably be not more than 0.8 μm, more preferably not more than 0.65 μm, in view of attaining high densification of the electric circuits in a circuit board.

At least one surface of the resin-impregnated fabric sheet according to the present invention may be covered with another substrate (metal or sheet), or may be coated with another resin or a coating, or may be molded. Further, the resin-impregnated fabric sheet according to the present invention may be cross-linked by oxidation by heat or UV.

A process for producing the resin-impregnated fabric sheet according to the present invention will now be described. However, the process is not restricted thereto.

The PPS used in the present invention may be obtained by reacting alkali sulfide with paradihalobenzene in a polar solvent at a high temperature and under high pressure. Especially, it is preferred to react sodium sulfide with p-dichlorobenzene in an amide-containing high boiling polar solvent such as N-methylpyrrolidone. In this case, in order to control polymerization degree, it is preferred to carry out the reaction in the presence of a polymerization accelerator such as alkali hydroxide, alkaline metal carboxylate or the like at 230°–280° C. The pressure of the polymerization system and the polymerization time are appropriately selected depending on the type and amount of the accelerator and on the desired polymerization degree. The obtained polymer in the form of powder or granules is washed with water and/or a solvent to remove a salt produced as a side product, polymerization accelerator, non-reacted monomers and the like. To the thus obtained polymer, inorganic or organic additives and the like may be added, if necessary, in amounts not hindering attainment of the object of the present invention, thereby obtaining the PPS resin composition.

The resin-impregnated fabric sheet according to the present invention has the fabric sheet (A) impregnated with the above-described PPS resin composition (B). To control the orientation degree of the resin layer in the resin-impregnated fabric sheet within the range defined in the present invention, it is best preferred to hot-press the oriented films made of the resin composition with the fabric sheet.

An oriented film of PPS resin may be obtained as follows. First, the resin composition is dried in vacuum at 150°–180° C. for 1–3 hours and the dried composition is supplied to a melt extruder. The polymer composition is heated at a temperature (preferably 290°–350° C.) higher than the melting point thereof and well kneaded. Then the composition is continuously extruded from a die in the form of slit to obtain a sheet. The sheet is then rapidly cooled to a temperature lower than the glass transition point of the polymer, thereby obtaining substantially non-oriented PPS sheet.

The obtained PPS sheet is then uniaxially or biaxially stretched by a well-known stretching method such as sequential biaxial stretching method, simultaneous biaxial stretching method, tubular method, roll method or the like. In cases where the stretching is carried out in batch, a film stretcher may be used. If sequential biaxial stretching method is employed for example, the sheet is first stretched in the longitudinal direction with a stretcher comprising a group of rolls to obtain a uniaxially stretched film. In this step, the stretching temperature may preferably be 90°–120° C. and the stretching ratio may preferably be 1.3–4.5 times original length. The film is then stretched in the transverse direction in a tenter. The stretching conditions described for the longitudinal stretching may be employed, thereby obtaining a biaxially oriented film. The film is then heatset in a heatset chamber subsequent to the tenter under a constant length or allowing limited relaxation by up to 15%. The heatset temperature may preferably be 200°–285° C. and the heatset time may preferably 1–90 seconds. Further, as required, the film may then be annealed under limited relaxation or under free condition in order to reduce the thermal shrinkage of the film. The orientation degree (OF) of the thus obtained film may preferably be 0.1–0.75 in order to attain the object of the present invention. Use of a biaxially oriented film is especially preferred.

The hot-press of the fabric sheet and the oriented PPS film described above to produce the resin-impregnated fabric sheet may be carried out by sandwiching the fabric sheet between a pair of the films and hot-pressing the obtained laminate by the hot plate pressing method, heat roll pressing method or by a method in which the laminate is pressed between hot metal belts. In the hot-press step, a temperature of 290°–350° C., a pressure of 1–30 kg/cm$^2$ and a time needed for carrying out impregnation usually 0.5–3 hours are preferred in view of the impregnation degree and thermal dimensional stability. However, unless the above-mentioned conditions are appropriately selected depending on the orientation degree (OF) of the film employed, the orientation degree (OF) of the resin layer in the resin-impregnated fabric sheet cannot be controlled within the range defined in the present invention and so the object of the present invention cannot be attained.

The ratio (B/A) of the thickness of the PPS film (B) to the thickness of the fabric sheet (A) before the hot-press is preferably 0.3–3.0 in order to attain the object of the present invention.

Methods for measuring the characteristics employed for describing the present invention, as well as methods for evaluating the characteristics will now be described.

(1) Measurement of Orientation Degree OF by Wide Angle X-ray Diffraction Method

Sheets were laminated to a thickness of 1 mm along the same direction and the laminate was cut into pieces thereby obtaining samples having a thickness of 1 mm, width of 1 mm and a length of 1 mm (Fixation of each sheet was carried out using collodion solution in 5% aluminum acetate solution). X-ray was impinged along the surface of the sheet (in the Edge direction and in the End direction) and plate photographs were taken. As the X-ray generator, model D-3F commercially available from RIGAKU DENKI was used. The used X-ray was Cu-Ka-line generated at 40 kV–20 mA after filtration through a Ni filter. The distance between the sample and the film was 41 mm. A non-screen type film manufactured by KODAK was used and the multiple exposure (15 minutes and 30 minutes) was employed. The degree of blackness of the intensity of the (2 0 0) peak on the plate photograph was measured by scanning by a densitometer from the center of the photograph to radial direction along the direction of $\phi=0°$ (on the equator), 10°, 20° and 30°. The orientation degree (OF) of each sample is defined by the following equation:

$$OF=(I\phi=30°)/(I\phi=0°)$$

Here, $I\phi=30°$ means the maximum intensity of the scanning in the direction of 30°, and $I\phi=0°$ means the maximum intensity in the direction of equator. Average of $I\phi=0°$ and $I\phi=180°$ was employed as $I\phi=0°$, and average of $I\phi=30°$ and $I\phi=150°$ was employed as $I\phi=30°$. The conditions of measurement by using the densitometer were as follows.

As the densitometer, SAKURA MICRODENSITOMETER MODEL PDM-5 TYPE A commercially available from KONICA CORPORATION was employed. The measured range of concentration was 0.0–4.0 D (in terms of minimum measurement area of 4 $\mu m^2$). The optical magnification was 100× and a slit with a width of 1 μm and a height of 10 μm was used. The film transfer speed was 50 μm/second and the chart velocity was 1 mm/second.

(2) Resin Impregnation Degree (%)

An electron micrograph of a cross-section of the resin-impregnated fabric sheet was taken and the ratio of the total of the length of the arcs of the fibers contacting the resin or the fiber next thereto to the total of the length of circumferences of the fibers was determined. Twenty fields were randomly selected and the average of the determined values was employed as the impregnation degree (%) (The magnification of the electron microscope was 3000×).

If the impregnation degree is not more than 85%, the through hole processability described below is bad.

(3) Heat Resistance

On a solder bath of which temperature is set to 280° C., a sample sizing 2 cm×2 cm was floated for 30 seconds and the state of the sample was evaluated according to the following criteria.

○: No change is observed at all.

△: Softening, deformation, peeling or wrinkles are observed in a part of the sample.

X: Deformation such as waving or bending, or peeling is observed in the entire surface and the dimensional change of each layer is large.

In the above-described criteria, "X" is the level unacceptable for a circuit board.

(4) Heat Shrinkage

A certain direction in the circuit board is selected as a base direction and a sample sizing 100 mm×10 mm is cut out in the direction perpendicular to the base direction. Sites in the conductors of the circuit are marked and the distance (p mm) between the marks is precisely read by using a microscope. The sample is then aged in a furnace (hot air type) at 240° C. or 265° C. for 30 minutes, and the distance between the marks is precisely measured (r mm). The heat shrinkage (%) in each direction was determined according to the following equation and the average of the thus determined values was employed as the heat shrinkage (%).

Heat Shrinkage $(\%)=(p-r)/p\times 100$

The larger the heat shrinkage, the larger the shift of the circuit herein below described.

(5) Dielectric Characteristics (Dielectric Loss)

Change in the dielectric loss was measured changing the frequency according to JIS-C-6481 (ASTM D150).

(6) Shift of Circuit

A circuit board was passed through a furnace (infrared type) of which temperature was set to 250° C. for 5 seconds. The thus treated circuit board was compared with a circuit board which was not passed through the furnace to check the shift of the circuit.

○: Shift of the circuit is hardly observed and so there is no problem at all.

△: Although the circuit is slightly shifted, the circuit board can be managed to be used by correction during the manufacture of the circuit board.

X: The shift of the circuit is large, which cannot be corrected during the manufacture of the circuit board.

(7) Through Hole Processability

To evaluate the through hole processability of a circuit board, a hole with a diameter of 2 mm was formed in the resin-impregnated fabric sheet by punching and ink as a substitute of an electro-conductive paste was contacted with the cut surface of the hole. The state of the ink permeated into the sheet was evaluated according to the following criteria.

○: The length of the permeated ink is less than 1 mm.

△: The length of the permeated ink is 1 mm–5 mm.

X: The length of the permeated ink is not less than 5 mm.

If this processability is of the level of "X", the circuit forms a short-circuit with another circuit so that the sheet cannot be used as a circuit board.

(8) Mechanical Properties

The resin-impregnated fabric sheet was repeatedly bent at right angles and the number of times of bending at which a crack was formed in the resin layer was determined.

(9) Measurement of Ratio of Thickness Layer Containing PPS Resin Alone to Thickness of Fabric Sheet Layer Impregnated with Resin This ratio was determined by examining an electron micrograph (magnification: 1000)× of a cross-section.

(10) Average Surface Roughness (Ra)

Average surface roughness (μm) measured by the pin-touch type surface roughness meter according to JIS-B-0601 (ISO 468-1982) is shown (cut off: 0.08 mm, measured length: 4 mm).

(11) Ratio (x/y) of Maximum Value (x) to Minimum Value (y) of Orientation Degrees of PPS Layer A resin-impregnated fabric sheet was examined for the angle dependency of intensity of transmittance of microwave (4 GHz) by a molecular orientation meter (MOA-2001A, manufactured by KS SYSTEM CO., LTD.) and the maximum value (x) and the minimum value (y) thereof were determined. From these values, the ratio (x/y) was calculated. The orientation pattern of the molecules can be known from the angle dependence of the transmittance intensity of microwave, which reflects the interaction between the microwave and the polar molecules constituting the resin.

The present invention will now be described by way of examples thereof. However, the present invention is not restricted to the examples.

EXAMPLE 1

(1) Preparation of PPS Composition

To an autoclave, 32.6 kg (250 moles, containing 40% by weight of crystal water) of sodium sulfide, 100 g of sodium hydroxide, 36.1 kg of sodium benzoate (250 moles) and 76.2 kg of N-methyl-pyrrolidone (hereinafter also referred to as "NMP") were fed and the mixture was dehydrated at 205° C. Then 37.1 kg of 1,4-dichlorobenzene (255 moles) and 20.0 kg of NMP were added to the mixture and the resultant was allowed to react at 265° C. for 4 hours. The reaction product was washed with water and dried to obtain 21.1 kg (yield: 78%) of poly-p-phenylene sulfide having a melt viscosity of 3100 poises.

To the thus obtained polymer, 0.1% by weight of fine silica particles having an average particle size of 0.7 µm and 0.05% by weight of calcium stearate were added and the resultant was melt-extruded at 310° C. from an extruder having a diameter of 30 mm to obtain pellets of PPS composition.

(2) Preparation of Biaxially Oriented PPS Film

The thus obtained pellets of the composition were dried in vacuum at 180° C. for 3 hours. The dried pellets were melted at 310° C. in an extruder having a diameter of 40 mm and the melt was filtered through a metal mesh having a 95% cut mesh size of 10 µm. The filtrate was extruded from a T-shaped die having a linear lip with a length of 400 mm and a gap of 0.5 mm. The extruded sheet was cast on a metal drum having a surface temperature kept at 25° C. to obtain a non-oriented sheet with a thickness of 350 µm (PPS sheet-1).

The PPS sheet-1 was stretched in the longitudinal direction with a longitudinal stretching apparatus containing a group of rolls at 95° C. to 3.5 times original length. Thereafter, the resulting film was stretched in the transverse direction in a subsequent tenter at 100° C. to 3.5 times original length. The obtained film was heatset at 270° C. in a heatset chamber subsequent to the tenter under relaxation by 5% to obtain a biaxially oriented PPS film having a thickness of 25 µm (PPS film-1). The OF of the obtained film was 0.25 in both the Edge and End directions.

(3) Provision of Fabric Sheet

A glass cloth (fabric sheet-1) having a ratio of density of warps to the density of wefts of 1.1, a basis weight of 47 g/m² and a thickness of 55 µm (EPC050: manufactured by ARISAWA SEISAKUSHO CO., LTD.) was used.

(4) Production of Resin-impregnated Fabric Sheet

The fabric sheet-1 was sandwiched between a pair of the PPS films-1 to obtain a three-ply substrate. This substrate was sandwiched between a pair of SUS plates having a thickness of 3 mm. Further, fabric sheets having heat resistance and a thickness of 5 mm were placed on the SUS plates. The substrate was then hot-pressed by the hot plate press method. The press temperature was 320° C. and the pressure was 10 kg/cm². The press time at 320° C. was 60 minutes. After the press, the sheet was cooled by water to 60° C. at a cooling rate of 2° C./min, thereby obtaining a PPS resin-impregnated fabric sheet with a thickness of 78 µm (impregnated sheet-1). The results of evaluation of this resin-impregnated fabric sheet are shown in Tables 1 and 2.

COMPARATIVE EXAMPLE 1

Using the PPS films-1 and the fabric sheet-1, the same procedure as in Example 1 was repeated except that the hot-press was carried out at 295° C. or 370° C. under a pressure of 10 kg/cm² and with a hot-press time at this temperature of 120 minutes, to obtain two types of resin-impregnated fabric sheets. The resin-impregnated fabric sheet obtained employing the hot-press temperature of 295° C. is designated impregnated sheet-2 and the resin-impregnated fabric sheet obtained employing the hot-press temperature of 370° C. is designated impregnated sheet-3. The results of evaluation of these resin-impregnated fabric sheets are shown in Tables 1 and 2.

EXAMPLE 2

PPS sheets were prepared by the method described in Example 1, and the PPS sheets were subjected to simultaneous biaxial stretching using a film stretcher (manufactured by T.M. LONG CO., LTD., U.S.) at 95° C. The stretching ratios were 1.5, 2.0, 2.5, 3.0, 3.5 and 4.5 times original length in both the longitudinal and transverse directions (The films are designated PPS film-2 to PPS film-7 in the order mentioned). The thickness of the films was controlled to 25 µm. Each film was sandwiched between a pair of aluminum frame and heatset under a constant length at 265° C. for 60 seconds.

The fabric sheet-1 and the PPS films-2 to -7 were hot-pressed by the method described in Example 1 to obtain 6 types of resin-impregnated fabric sheets (designated impregnated sheet-4 to -9, respectively). The results of evaluation of these resin-impregnated fabric sheets are shown in Tables 1 and 2.

EXAMPLE 3

Using the PPS film-1 and the fabric sheet-1 obtained in Example 1, the same procedure as in Example 1 was repeated except that the hot-press temperature was 310° C. and a press time of 20 minutes to obtain a resin-impregnated fabric sheet (designated impregnation sheet-10). The results of evaluation of this resin-impregnated fabric sheet are shown in Tables 1 and 2. The ratio of planar orientation (x/y) of the resin in this resin-impregnated fabric sheet was 4.10 and the anisotropy of the heat shrinkage is large, so that the shift of circuit tends to be large and the heat resistance tends to be not good.

EXAMPLE 4

Using the PPS films-1 and the fabric sheet-1 obtained in Example 1, the same procedure as in Example 1 was repeated except that the hot-press temperature was 310° C. or 320° C. and the press time was 30 minutes, to obtain two types of resin-impregnated fabric sheets (designated impregnated sheet-11 and -12, respectively). The results of evaluation of these resin-impregnated fabric sheets are shown in Tables 3 and 4.

COMPARATIVE EXAMPLE 2

PPS non-oriented sheets having a thickness of 25 µm were prepared by the method described in Example 1, and the obtained PPS non-oriented sheets and the fabric sheet-1 were hot-pressed at a press temperature of 280° C., 295° C. or 320° C. to obtain 3 types of resin-impregnated fabric sheets (designated impregnated sheet-13 to -15, respectively). The results of evaluation of these resin-impregnated fabric sheets are shown in Tables 3 and 4.

EXAMPLE 5

By the method described in Example 1, 4 types of biaxially oriented films (PPS film-8 to -11) having thicknesses of 9 μm, 16 μm, 50 μm and 75 μm, respectively, were prepared. These films were hot-pressed with the fabric sheet-1 to obtain 4 types of resin-impregnated fabric sheets. The resin-impregnated fabric sheets obtained by using PPS film-8, -9, -10 and -11 are designated resin-impregnated fabric sheet-16, -17, -18 and -19, respectively. The conditions and method of the hot-press were the same as in Example 1. The results of evaluation of these resin-impregnated fabric sheets are shown in Tables 3 and 4.

EXAMPLE 6

The laminate containing PPS films-1 and the fabric sheet-1 having the same structure as in Example 1 was hot-pressed by heat press rolls coated with a releasing agent (temperature: 310° C. pressure: 10 kg/cm$^2$ rate: 0.5 m/min) to obtain a resin-impregnated fabric sheet (designated impregnated sheet-20). The results of evaluation of this resin-impregnated fabric sheet are shown in Tables 3 and 4.

COMPARATIVE EXAMPLE 3

The PPS film-11 having a thickness of 75 μm prepared in Example 4 was provided. The results of evaluation of this film are shown in Tables 3 and 4.

COMPARATIVE EXAMPLE 4

One surface of each of the PPS films-1 was subjected to corona discharge treatment with an energy of 6000 J/m$^2$ and the films were laminated on the fabric sheet-1 in the same manner as in Example 1 using an epoxy adhesive ("KEMIT EPOXY" TE-5920, commercially available from TORAY INDUSTRIES, INC). That is, the adhesive was applied by the gravure roll method to each surface of the PPS films-1 to a thickness of 10 μm (in dried state), to which corona discharge treatment was performed, and the PPS films were laminated on both surfaces of the fabric sheet-1. The adhesive was dried at 100° C. for 3 minutes, and the obtained laminate was hot-pressed at 120° C. under a pressure of 3 kg/cm$^2$ by the heat roll press method. The resulting laminate was further thermally cured at 150° C. for 2 hours (laminate-1). The results of evaluation of this laminate are shown in Tables 3 and 4.

TABLE 1

| | Orientation Degree of PPS Film (OF) | | Ratio of Thickness | Orientation Degree of Impregnated Sheet (OF) | | Impregnation | Average Surface | |
|---|---|---|---|---|---|---|---|---|
| | Edge | End | (b/a) | Edge | End | Degree % | Roughness (μm) | Sample No. |
| Example 1 | 0.25 | 0.25 | 1.2 | 0.71 | 0.70 | 95 | 0.31 | Impregnated Sheet-1 |
| Comparative Example 1 | 0.25 | 0.25 | 1.2 | 0.29 | 0.29 | 86 | 0.58 | Impregnated Sheet-2 |
| Example 2 | 0.25 | 0.25 | 1.2 | 0.92 | 0.91 | 97 | 0.44 | Impregnated Sheet-3 |
| | 0.75 | 0.73 | 1.2 | 0.88 | 0.89 | 95 | 0.34 | ImPregnated Sheet-4 |
| | 0.52 | 0.52 | 1.2 | 0.85 | 0.84 | 96 | 0.32 | Impregnated Sheet-5 |
| | 0.46 | 0.45 | 1.2 | 0.83 | 0.83 | 97 | 0.47 | Impregnated Sheet-6 |
| | 0.28 | 0.27 | 1.2 | 0.80 | 0.79 | 96 | 0.50 | Impregnated Sheet-7 |
| | 0.19 | 0.20 | 1.2 | 0.61 | 0.62 | 88 | 0.58 | Impregnated Sheet-8 |
| | 0.11 | 0.12 | 1.2 | 0.32 | 0.31 | 86 | 0.65 | Impregnated Sheet-9 |
| Example 3 | 0.25 | 0.25 | 1.2 | 0.51 | 0.52 | 79 | 0.68 | Impregnated Sheet-10 |

TABLE 2

| | Dimensional Change (%) | | Ratio of Orientation | Heat Resistance | Mechanical Properties Bending | Shift of | Through Hole | Dielectric Loss | |
|---|---|---|---|---|---|---|---|---|---|
| | 240° C. | 265° C. | Degree (x/y) | tance | Property (times) | Circuit | Processability | (1 MGHz) | Sample No. |
| Example 1 | 0.05 | 0.06 | 1.20 | ○ | 8 | ○ | ○ | 0.0020 | Impregnated Sheet-1 |
| Comparative Example 1 | 0.25 | 0.55 | 3.84 | Δ | 15 | X | Δ | 0.0021 | Impregnated Sheet-2 |
| Example 2 | 0.02 | 0.03 | 1.18 | ○ | 1 | ○ | ○ | 0.0023 | Impregnated Sheet-3 |
| | 0.03 | 0.03 | 1.22 | ○ | 2 | ○ | ○ | 0.0021 | Impregnated Sheet-4 |
| | 0.03 | 0.04 | 1.35 | ○ | 4 | ○ | ○ | 0.0024 | Impregnated Sheet-5 |
| | 0.04 | 0.05 | 1.50 | ○ | 5 | ○ | ○ | 0.0021 | Impregnated Sheet-6 |
| | 0.05 | 0.07 | 2.27 | ○ | 7 | ○ | ○ | 0.0022 | Impregnated Sheet-7 |
| | 0.12 | 0.19 | 2.68 | ○ | 9 | Δ | ○ | 0.0024 | Impregnated Sheet-8 |
| | 0.18 | 0.24 | 3.38 | ○ | 12 | Δ | Δ | 0.0021 | Impregnated Sheet-9 |
| Example 3 | 0.23 | 0.45 | 4.10 | Δ | 11 | Δ | Δ | 0.0023 | Impregnated Sheet-10 |

TABLE 3

| | Orientation Degree of PPS Film (OF) | | Ratio of Thickness | Orientation Degree of Impregnated Sheet (OF) | | Impregnation Degree (%) | Average Surface Roughness (μm) | Sample No. |
|---|---|---|---|---|---|---|---|---|
| | Edge | End | (b/a) | Edge | End | | | |
| Example 4 | 0.25 | 0.25 | 1.2 | 0.59 | 0.60 | 85 | 0.47 | Impregnated Sheet-11 |
| | 0.25 | 0.25 | 1.2 | 0.66 | 0.67 | 92 | 0.41 | Impregnated Sheet-12 |
| Comparative Example 2 | 0.93 | 1.93 | 1.2 | 0.91 | 0.92 | 78 | 0.37 | Impregnated Sheet-13 |
| | 0.93 | 0.93 | 1.2 | 0.93 | 0.93 | 87 | 0.31 | Impregnated Sheet-14 |
| | 0.93 | 0.93 | 1.2 | 0.93 | 0.93 | 95 | 0.30 | Impregnated Sheet-15 |
| Example 5 | 0.25 | 0.25 | 0.3 | 0.82 | 0.81 | 85 | 0.87 | Impregnated Sheet-16 |
| | 0.24 | 0.24 | 0.5 | 0.80 | 0.79 | 94 | 0.45 | Impregnated Sheet-17 |
| | 0.28 | 0.27 | 1.6 | 0.83 | 0.81 | 96 | 0.35 | Impregnated Sheet-18 |
| | 0.30 | 0.29 | 2.3 | 0.81 | 0.81 | 96 | 0.29 | Impregnated Sheet-19 |
| Example 6 | 0.25 | 0.25 | 1.2 | 0.79 | 0.80 | 92 | 0.25 | Impregnated Sheet-20 |
| Comparative Example 3 | — | — | — | — | — | — | — | PPS Film-11 |
| Comparative Example 4 | — | — | — | — | — | — | — | Laminate-1 |

TABLE 4

| | Dimensional Change (%) | | Ratio of Orientation | Heat Resistance | Mechanical Properties Bending | Shift of Circuit | Through Hole Processability | Dielectric Loss | Sample No. |
|---|---|---|---|---|---|---|---|---|---|
| | 240° C. | 265° C. | Degree (x/y) | | Property (times) | | | (1 MGHz) | |
| Example 4 | 0.15 | 0.21 | 2.80 | Δ | 9 | Δ | Δ | 0.0021 | Impregnated Sheet-11 |
| | 0.06 | 0.08 | 1.65 | O | 8 | O | O | 0.0020 | Impregnated Sheet-12 |
| Comparative | 0.25 | 0.60 | 3.26 | Δ | 1 | X | X | 0.0026 | Impregnated Sheet-13 |
| tive | 0.11 | 0.20 | 1.87 | O | 1 | Δ | O | 0.0021 | Impregnated Sheet-14 |
| Example 2 | 0.03 | 0.03 | 1.20 | O | 1 | O | O | 0.0023 | Impregnated Sheet-15 |
| Example 5 | 0.12 | 0.18 | 1.22 | O | 4 | Δ | Δ | 0.0050 | Impregnated Sheet-16 |
| | 0.01 | 0.02 | 1.38 | O | 10 | O | O | 0.0028 | Impregnated Sheet-17 |
| | 0.07 | 0.15 | 1.25 | O | 6 | O | O | 0.0021 | Impregnated Sheet-18 |
| | 0.10 | 0.22 | 2.05 | O | 4 | Δ | O | 0.0019 | Impregnated Sheet-19 |
| Example 6 | 0.06 | 0.08 | 1.35 | O | 7 | O | O | 0.0023 | Impregnated Sheet-20 |
| Comparative Example 3 | 8.70 | 14 or more | - | X | 20 or more | X | O | 0.0017 | PPS Film-11 |
| Comparative Example 4 | 8.00 | 14 or more | - | X | 20 or more | X | X | 0.9100 | Laminte-1 |

INDUSTRIAL AVAILABILITY

As described above, the resin-impregnated fabric sheet according to the present invention has largely improved heat resistance, thermal dimensional stability, dielectric characteristics and mechanical properties when bent, and the impregnation degree of the resin into the fabric sheet is high so that the processability in the direction of thickness such as application of electro-conductive paste or metal plating is good. Therefore, the resin-impregnated fabric sheet is best suited as an insulation substrate for circuit boards and for multilayer wiring boards to which high densification of the circuits and decrease in the thickness are demanded.

Further, the resin-impregnated fabric sheet according to the present invention may be applied to heat resistant insulation substrates used in motors, encapsulators of cables used at high temperature and under high pressure, heat resistant adhesive tapes, substrates for prepregs, heat resistant labels, speaker corns, substrates for shields, washers, insulating spacers and the like.

We claim:

1. A resin-impregnated fabric sheet comprising:

a fabric sheet (A), and a resin composition (B) comprising poly-p-phenylene sulfide, wherein said resin composition (B) is impregnated in said sheet, and said resin composition (B) has an orientation degree of between about 0.3–0.9.

2. The resin-impregnated fabric sheet according to claim 1, wherein resin impregnation degree of said resin composition (B) containing poly-p-phenylene sulfide as a major component is not less than 85%.

3. The resin-impregnated fabric sheet according to claim 1, wherein the ratio (b/a) of the thickness (b) of the layer made of said resin composition alone to the thickness (a) of the layer in which said fabric sheet is impregnated with said resin composition is 0.25–2.5.

4. The resin-impregnated fabric sheet according to any one of claims 1–3, wherein said fabric sheet (A) is not melted at 400° C.

5. The resin-impregnated fabric sheet according to claim 1, wherein said fabric sheet (A) is made of glass fibers.

6. The resin-impregnated fabric sheet according to claim 1, wherein the ratio (x/y) of the maximum value (x) to the minimum value (y) of the orientation degree of said resin composition (B) containing poly-p-phenylene sulfide as a major component is not more than 4.0.

7. The resin-impregnated fabric sheet according to claim 1, wherein said resin-impregnated fabric sheet has an average surface roughness (Ra) of not more than 0.8 μm.

* * * * *